United States Patent
Götzinger et al.

(10) Patent No.: US 9,648,758 B2
(45) Date of Patent: May 9, 2017

(54) METHOD FOR PRODUCING A CIRCUIT BOARD AND USE OF SUCH A METHOD

(71) Applicant: AT&S Austria Technologie & Systemtechnik Aktiengesellschaft, Leoben-Hinterberg (AT)

(72) Inventors: Siegfried Götzinger, Mattersburg (AT); ShuYing Yao, Shanghai (CN); Mikael Tuominen, Shanghai (CN); Beck Han, Fu Qing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 99 days.

(21) Appl. No.: 14/379,738

(22) PCT Filed: Feb. 19, 2013

(86) PCT No.: PCT/AT2013/000029
§ 371 (c)(1),
(2) Date: Aug. 19, 2014

(87) PCT Pub. No.: WO2013/123534
PCT Pub. Date: Aug. 29, 2013

(65) Prior Publication Data
US 2015/0007934 A1     Jan. 8, 2015

(30) Foreign Application Priority Data

Feb. 21, 2012 (AT) .................................... 62/2012 U

(51) Int. Cl.
B32B 7/06 (2006.01)
B32B 37/26 (2006.01)
(Continued)

(52) U.S. Cl.
CPC ........... *H05K 3/4644* (2013.01); *F03B 3/121* (2013.01); *F03B 13/264* (2013.01);
(Continued)

(58) Field of Classification Search
USPC ......... 156/250, 257, 267, 268, 272.2, 272.8, 156/701, 717
See application file for complete search history.

(56) References Cited

U.S. PATENT DOCUMENTS

| | | |
|---|---|---|
| 4,931,134 A | 6/1990 | Jacques et al. |
| 2009/0026168 A1 | 1/2009 | Tsai et al. |

(Continued)

FOREIGN PATENT DOCUMENTS

| | | |
|---|---|---|
| AT | 13434 U1 | 12/2013 |
| DE | 20221189 U1 | 6/2005 |

(Continued)

OTHER PUBLICATIONS

English Abstract of WO 2008/104324 (Mar. 16, 2016).*
(Continued)

*Primary Examiner* — Sing P Chan
(74) *Attorney, Agent, or Firm* — KPPB LLP

(57) ABSTRACT

A method for producing a circuit board comprising the following steps:—providing at least one first element of the circuit board to be produced, more particularly a multilayer core element;—applying an adhesion-preventing material to a region of the first element to be subsequently exposed;—applying at least one additional layer to the first element;—connecting the first element and the at least one additional layer; and—removing a portion of the additional layer to expose the region of the first element, wherein in the additional layer corresponding to the portion to be subse- (Continued)

Figure 1:
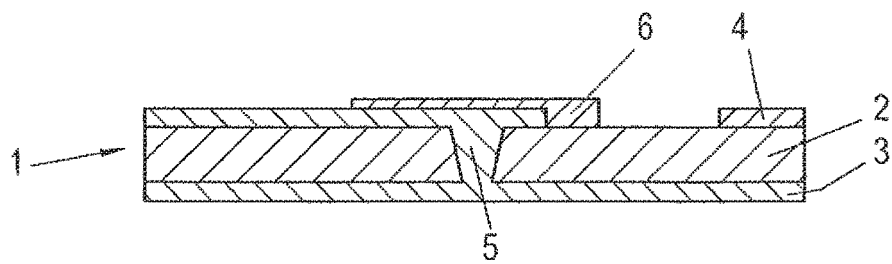

quently removed, the material of the additional layer is cut through on at least one edge of the portion to be subsequently removed.

16 Claims, 3 Drawing Sheets

(51) Int. Cl.
  *B32B 38/04* (2006.01)
  *B32B 38/10* (2006.01)
  *H05K 3/46* (2006.01)
  *F03B 3/12* (2006.01)
  *F03B 13/26* (2006.01)
  *F03D 1/06* (2006.01)
(52) U.S. Cl.
  CPC ......... *F03D 1/0658* (2013.01); *H05K 3/4614* (2013.01); *H05K 3/4691* (2013.01); *F05B 2260/30* (2013.01); *H05K 2201/09127* (2013.01); *H05K 2203/063* (2013.01); *Y02E 10/223* (2013.01); *Y02E 10/28* (2013.01); *Y02E 10/721* (2013.01)

(56) References Cited

U.S. PATENT DOCUMENTS

| | | | | |
|---|---|---|---|---|
| 2009/0241333 | A1* | 10/2009 | He | H05K 3/4691 29/830 |
| 2011/0272177 | A1* | 11/2011 | Weichslberger | H05K 3/4691 174/250 |

FOREIGN PATENT DOCUMENTS

| | | | | |
|---|---|---|---|---|
| DE | WO 2008104324 | A1* | 9/2008 | H01L 23/5389 |
| JP | 11150368 | A | 6/1999 | |
| JP | 2003198133 | A | 7/2003 | |
| JP | 2004031682 | A | 1/2004 | |
| WO | 2008098271 | A1 | 8/2008 | |
| WO | 2011088489 | A1 | 7/2011 | |

OTHER PUBLICATIONS

International Search Report for International Application PCT/AT2013/00029, completed May 31, 2013, 6 pgs.
Written Opinion for International Appliction PCT/AT2013/000029, 5 pgs.

* cited by examiner

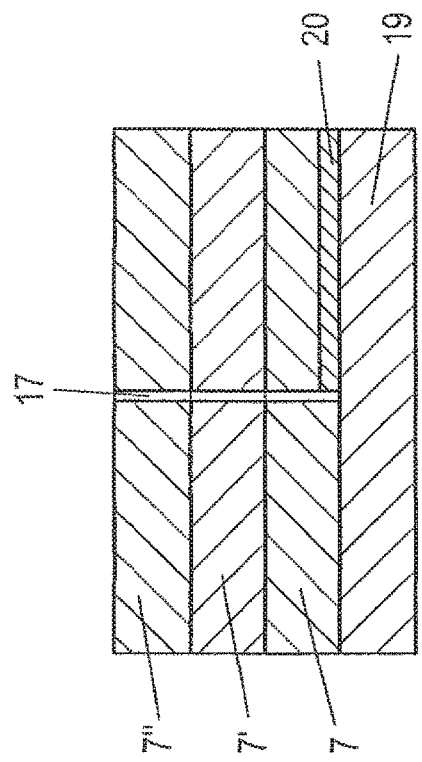
Fig. 4
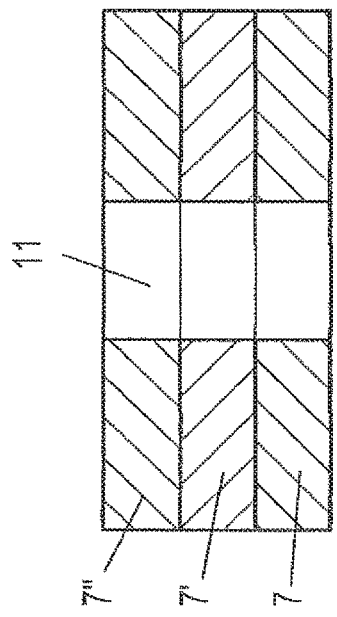
Fig. 5
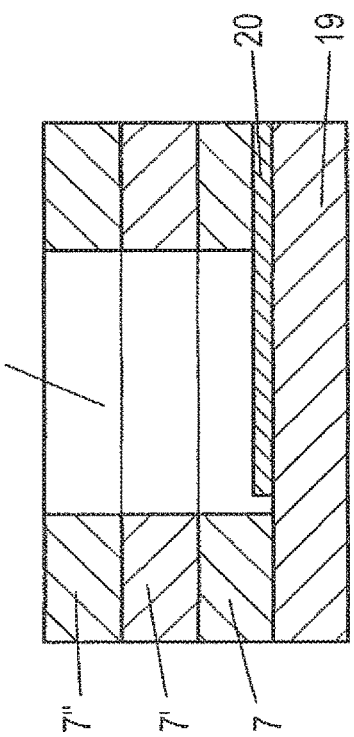
Fig. 6
Fig. 7

METHOD FOR PRODUCING A CIRCUIT BOARD AND USE OF SUCH A METHOD

The present invention relates to a method for producing a circuit board, comprising the following steps:

providing at least a first element, particularly a multilayer and, if applicable, a partly structured element, particularly a multilayer core element of the circuit board to be produced, applying a material that prevents adhesion or facilitates subsequent removal to a region of the first element to be exposed, after at least one further layer has been put in place, applying the at least one further layer to the first element, wherein the further layer is formed from a material that essentially covers the full area and is particularly non-conductive, connecting, particularly pressing or laminating the first element and the at least one further layer, and removing a portion of the further layer to expose the region of the first element.

The invention furthermore relates to the use of such a method.

In connection with the production of multilayer electronic components, particularly multilayer circuit boards, the design of such electronic components, which has become increasingly complex in recent years, has led, in general, to an increase in the number of interconnection and connection points of active components to parts of a circuit board, where with an increasing reduction in size, a reduction in the distance between such connection points is provided. In connection with the production of circuit boards, it has been proposed, for example, that such interconnection or connection points of components be disentangled by way of microvias, over several layers of circuit boards, in what are called High Density Interconnects (HDI).

Aside from a continued increase in the complexity of the design or construction of circuit boards, particularly in connection with the formation of cavities or cavities, and accompanying miniaturization, additional requirements have arisen with regard to foldable or bendable connections in a circuit board, which have led to the development of hybrid technology and to the use of what are called rigid-flexible circuit boards. Such rigid-flexible circuit boards, which consist of rigid regions or portions of the circuit board and of flexible regions connecting such rigid regions, increase reliability, offer further or additional possibilities for freedom of design or construction, and allow further miniaturization.

In connection with the production of rigid-flexible circuit boards, furthermore different methods are known, where after a circuit board that contains rigid and flexible portions has been built up, which portions have been or are connected with one another, removal of plies or layers usually situated above a flexible portion to be exposed is undertaken. In this connection, reference is made, as an example, to JP-A 2004031682, to JP-A 2003198133, to U.S. Pat. No. 4,931, 134 or to US-A 2009/0026168. In the latter reference, in particular, a method is disclosed, wherein after at least one flexible portion and at least one rigid portion of the circuit board to be produced have been provided, wherein the flexible and the rigid portion are connected with one another, further plies or layers of the circuit board to be produced are built up, and, after the structure has been completed, the flexible portion is exposed, using a cavity provided above the flexible portion. In the known embodiment according to US-A 2009/0026268, a cavity over the flexible portion to be subsequently exposed is covered by a copper layer, whereupon after completion of the circuit board, incisions all the way to the copper layer covering the cavity are made by means of a laser, for example, and then removal of the copper layer takes place, for final exposure of the flexible portion, using an etching solution that directly impacts the surface of the flexible portion after the copper layer has been severed. In order to avoid damage to the flexible portion to be exposed in this manner, in the known embodiment according to US-A 2009/0026168 a cover layer must additionally be provided over the flexible portion, where such a cover layer must be removed again, in complicated manner, for example for subsequent contacting in the flexible region or for placement of corresponding components. However, if the cover layer were not provided, damage to any structures or components exposed on the surface of the flexible portion would immediately occur when the etching solution was used, so that according to this known prior art, it is not possible to do without the complicated additional steps of applying a corresponding cover layer or protective layer, and subsequent at least partial removal of the same.

To prevent a connection between plies or layers to be connected with one another, or between essentially planar elements of a circuit board in a portion that is subsequently supposed to be exposed, it is furthermore known, for example, to prefabricate films that demonstrate adhesive properties accordingly, so that portions of the films that are supposed to provide adhesion of the material layers to be connected with one another are provided with recesses. Alternatively, aside from essentially full-area adhesive films prefabricated in accordance with the portion to be subsequently removed, prefabricated parting films can be used. It is directly evident that such prefabrication of such connection films or adhesive films and/or parting films is connected with great effort and that furthermore, great demands are made on register or orientation of the material layers to be connected with one another, with the interposition of such films, particularly prefabricated films.

Aside from the production of rigid-flexible circuit boards as described above, where a flexible circuit board region is to be exposed again after a plurality of working or processing steps has been carried out, if applicable, it is also known to once again expose elements or components situated in the interior of a circuit board, such as, for example, active or passive electronic components, or to provide cavities in the interior of such a circuit board.

Instead of the use of prefabricated adhesive films and, in particular, for simple clearing or exposure of portions, a method of the type stated initially has become known, for example, from WO 2008/098271, where the formation of such clearances or the exposure of flexible portions was greatly simplified by means of the use of a material that prevents adhesion or facilitates subsequent removal on a ply or layer or an element of the circuit board to be produced, which portion is to be subsequently exposed.

In such removal of portions of a further layer, which was connected, for example pressed or laminated with a first element or a first layer, for example a core element of the circuit board to be produced, it was particularly necessary to sever the additionally disposed further layers accordingly, in accordance with the portion to be exposed or cleared, where this was done, for example, using laser cutting. In order to prevent unintentional damage to portions of the circuit board, and, in particular, to limit the penetration depth of a laser during laser cutting, additional metallic layers, for example copper layers, usually had to be introduced into such circuit boards, which layers served as a limiting layer for laser cutting, as can also be derived, for example, from WO 2011/088489. Aside from the additional effort for the production of such supplemental limiting layers or stop layers for subsequent laser cutting, such layers or structures prevent the provision of conductive structures, for example, on the first or core element, which cover the boundary between the portion to be exposed and the portion not to be exposed, because it is directly evident that such structures are short-circuited by the provision of a continuous conductive or metallic layer as a laser stop layer, so that complicated additional contacting was necessary in such a case.

Furthermore, the production of precise or sharply delimited edges is not possible for a majority of the materials used for the production of circuit boards, particularly non-conductive plastic materials, for such exposed regions, because such plastic materials are subject to deformation, particularly during further processing steps at an elevated temperature and/or elevated pressure, if applicable, and therefore defined edge regions of exposed portions cannot be produced, or can be produced only in complicated manner. For this purpose, for example, expensive materials having low flow capacity must be used, or additional contouring steps, such as etching steps for providing straight-line border or edge regions must be provided, which in total lead to increased effort in the production of such circuit boards.

Furthermore, the use of plastic materials provided with reinforcements, for example fibers, particularly glass fibers, to achieve corresponding mechanical strength values is provided; such reinforcements require additional effort during severing after a connection with further plies or layers of a circuit board, and thereby also lead to increased effort in the production of a circuit board.

The present invention is therefore aimed at providing a method for producing a circuit board of the type stated initially, and a use of such a method, where the disadvantages of the known prior art as mentioned above are avoided in the formation of cleared regions or removal of portions of at least one ply or layer of a multilayer circuit board, or at least can be reduced to a great extent. In this connection, the invention is particularly aimed not only at providing such exposed portions at reduced method or production effort, but also allowing correspondingly sharp or precisely defined border or edge regions, particularly without the use of special and usually expensive materials, and without the use of additional method steps.

To accomplish these tasks, a method of the type stated initially is characterized essentially in that in the further layer, severing of the material of the further layer is carried out in accordance with the portion to be subsequently removed, on at least one edge of the portion to be removed, and, if necessary, filling of the severed region with a material different from the material of the further layer is carried out before any application to the first element and/or any connection with the same. Because, according to the invention, severing is carried out in the further layer, in accordance with the portion to be removed, on at least one edge of this portion, before any connection with the first element, for example the core element, the portion to be subsequently removed or a border or edge region of the same can be prepared, at least in part, in the further layer, in a simple method step, which is particularly carried out separately, whereupon essentially a planned breaking point for subsequent removal of the portion to be removed is provided after any placement on the first element and/or any connection with the same. This severed region can be broken, for example in the production of a rigid-flexible circuit board, by bending the same, essentially without any additional method steps, and can thereby be severed in simple manner. In this connection, precisely defined border or edge regions of the portion to be subsequently produced can be defined and provided, so that it is also possible to do without complicated additional processing steps of such border or edge regions. Furthermore, by providing a region that is severed in advance, it can be ensured that elements or components, for example, that lie underneath do not have to be protected by means of corresponding additional measures, because no additional covering or barrier layers composed of a conductive material need to be provided, either, particularly for severing by means of laser cutting, for example. By means of doing without such additional structures composed of a conductive material, it is furthermore possible to provide for the formation of conductive structures on the first element that extend beyond the boundary surface between the portion to be removed and regions not to be removed, so that simplified conductive structures, which particularly cover this boundary surface, can also be provided. Furthermore, by filling the severed region with a material that can be removed in correspondingly simple manner, the removal process of the portion to be removed can be simplified, and it can also be ensured, by means of such filling of the severed region, that structures that lie below this severed region are appropriately and reliably protected during subsequent working or processing steps, after application of the further layer.

To facilitate removal of the portion to be removed, it is proposed, according to a preferred embodiment, that the material of the further layer is severed at least on two edges of the essentially rectangular portion of the material of the further layer that lie opposite one another. In this way, a plurality of planned breaking points can be made available, where further or remaining edge regions of the portion to be removed are provided, which regions are particularly disposed at a distance from structures that are to be protected and lie underneath, and can accordingly also be severed in simple manner, using known means.

According to a further preferred embodiment, it is proposed that the material of the further layer is formed by a plastic material configured with a reinforcement, particularly reinforced with glass fibers, for example a prepreg material, where the severed portion of the further layer is filled by a plastic material without a reinforcement. By means of providing the reinforcements, a correspondingly strong material of the further ply or layer can be provided, while a plastic material without reinforcement is provided in the severed region, for protection of structures that lie underneath, in particular, which material subsequently allows correspondingly simplified separation of the portion to be removed, in the region that was already severed.

While filling of the region forming a planned breaking point with a corresponding material can be undertaken after production of the severed part of the further layer, before any connection with the first element, it is proposed, according to a further preferred embodiment, that the severed region of the further layer is filled, during the connection process with the first element of the circuit board, by the plastic material of the portions of the further layer that follow the severed region, by means of the elevated temperature and/or elevated pressure that occurs during the connection process. In such a manner, deformation or flow properties for such non-conductive layers are utilized under conditions of elevated temperature and/or elevated pressure, in order to result in filling of the severed region directly during the connection process with the first element, for protection of structures that lie underneath.

To achieve precisely defined border or edge structures and to simplify the implementation of severing of the border or edge region of the further layer, it is furthermore proposed that severing of the further layer is carried out on at least one edge of the portion to be removed, by means of milling, scoring, punching, slitting, cutting, particularly laser cutting, as this already corresponds to a further preferred embodiment of the method according to the invention.

As has already been indicated above, simplified release of the portion to be removed can be undertaken in that after the further layer and the first element have been connected, the portion to be removed is removed by breaking the severed region of the further layer, as this corresponds to a preferred embodiment of the method according to the invention.

Alternatively or additionally, it can furthermore preferably be provided, according to the invention, that after connection of the further layer with the first element, the material disposed in the severed region of the further layer is severed, at least in part, by means of cutting, particularly laser cutting using a $CO_2$ laser.

For the production of corresponding multilayer circuit boards, it is furthermore proposed, according to a further preferred embodiment, that a layer or ply of a conductive, particularly a structured material is provided on the further layer.

According to a further preferred embodiment, it is furthermore proposed that the first element of the circuit board to be produced is formed by a flexible material for the production of a rigid-flexible circuit board, where further advantages of the method according to the invention when used in connection with the production of rigid-flexible circuit boards have already been mentioned above, in part.

According to a further preferred embodiment, it is proposed that the first element is connected with at least one further layer on both surfaces, where subsequently, portions of the further layers that lie opposite one another are subsequently removed, in each instance, so that simultaneously, a structure can be built up using multiple plies or layers, particularly in joint connection steps, such as, for example, lamination steps.

As has already been mentioned multiple times, the method according to the invention can particularly be used or employed for the production of a multilayer circuit board.

Further preferred application possibilities of the method according to the invention lie in the production of at least one channel in a circuit board, in an exposure process for the production of cavities, particularly three-dimensional cavities or cavities in a circuit board, in the production of portions of a circuit board configured to be set back and/or step-shaped, in an exposure process for at least one element, particularly a register element, or of a component in the interior or in inner layers of a multilayer circuit board and/or in the production of a rigid-flexible circuit board.

Figure 2:
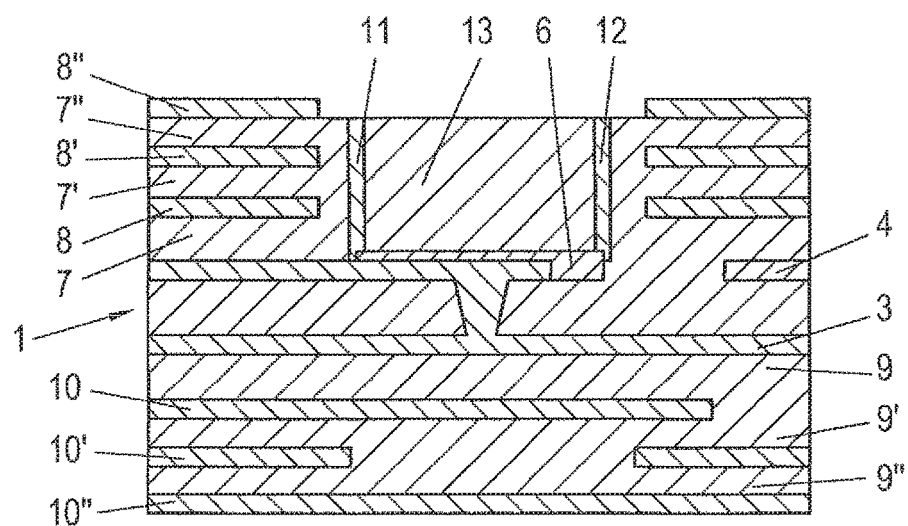
Figure 3:
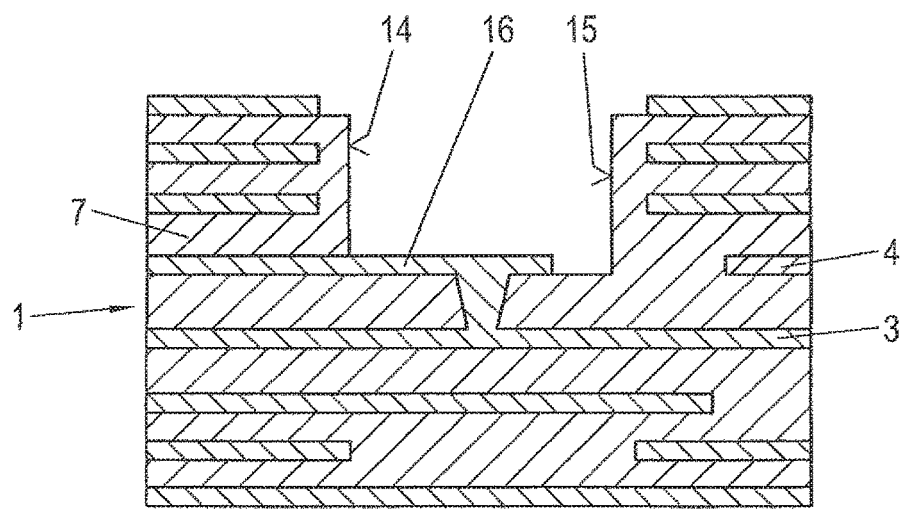
Figure 8:
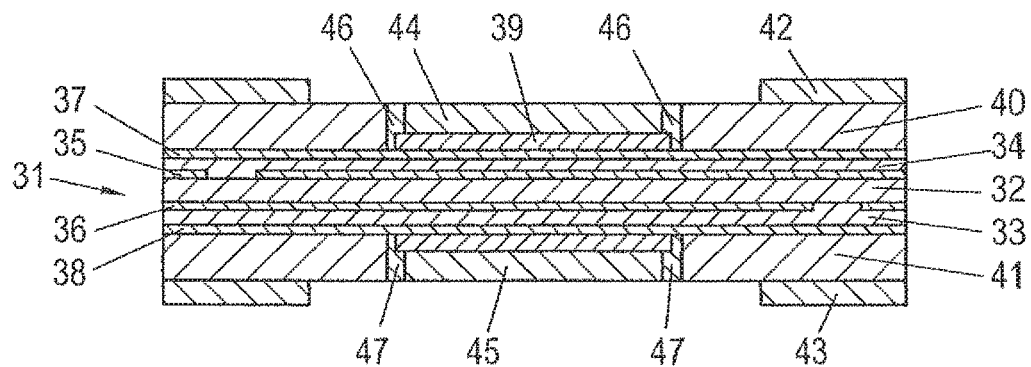
Figure 9:
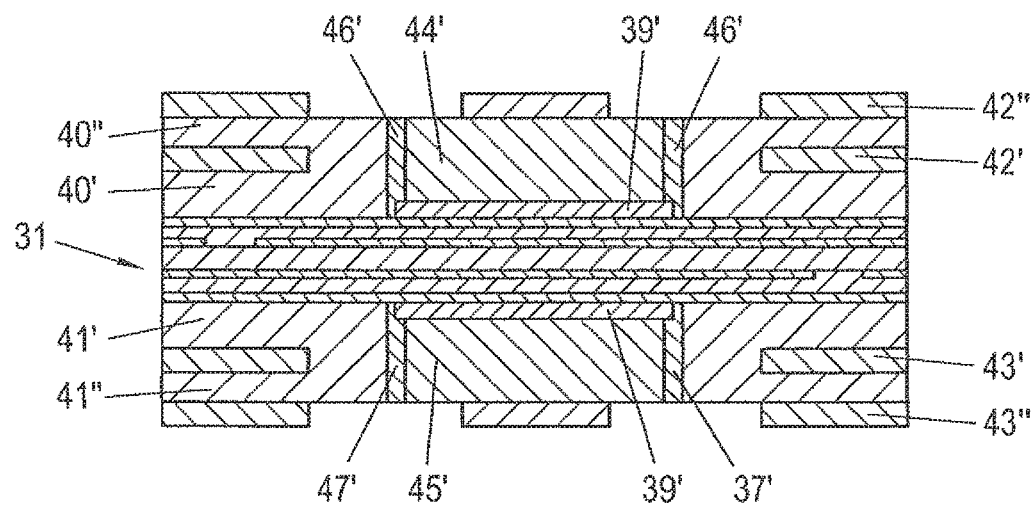
Figure 10:
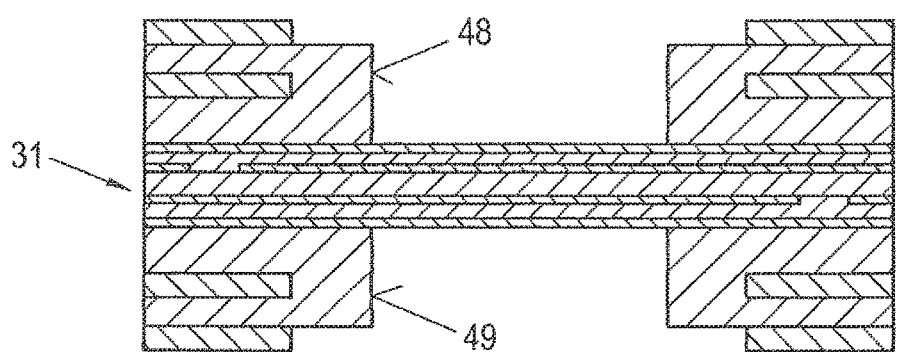

The invention will be explained in greater detail below, using exemplary embodiments of the method according to the invention for producing a circuit board shown schematically in the attached drawing. In the drawing, the figures show:

FIG. 1 a schematic partial section through a first element or core element of a circuit board to be produced according to the method according to the invention;

FIG. 2 also a partial section in a subsequent method step, where the core element shown in FIG. 1 was connected with a plurality of further plies or layers in accordance with the method according to the invention;

FIG. 3 a partial section similar to FIG. 2, where a portion of the further layers was removed again, in accordance with the method according to the invention, for exposure or clearing of a region of the core element;

FIG. 4 a schematic representation of a first embodiment of severing of a border or edge region of a portion of the further layer to be removed, before connection with the core element, in accordance with the method according to the invention;

FIG. 5, 6 sectional representations corresponding to FIG. 4, of further embodiments of severing of a border or edge region of a portion of the further layer to be removed, in accordance with the method according to the invention;

FIG. 7 a schematic representation of severing of a filled, previously severed border or edge region of the portion to be removed, in accordance with the method according to the invention;

FIG. 8 a schematic partial section similar to the representation in FIG. 2, through a modified embodiment, where a core element was connected, on both sides, with at least one further layer, particularly for the production of a rigid-flexible circuit board, in accordance with the method according to the invention;

FIG. 9 in a representation similar to FIG. 8, a partial section through a further modified embodiment for carrying out the method according to the invention, in the production of, once again, a rigid-flexible circuit board; and FIG. 10 a schematic partial section through the embodiment according to FIG. 9 after removal of the portions of the further plies or layers to be removed.

In FIG. 1, a portion of a first element or core element 1 of a circuit board to be produced is referred to as 1, where the core element essentially consists of a ply or layer 2 of a non-conductive material, and, on both surfaces, of layers 3 and 4 of a conductive material, where at least the upper ply or layer 4 is configured to be structured.

Furthermore, the core or core element itself can be a multilayer circuit board, where all the layers of the core element can be connected with one another in accordance with usual or known configurations, for example by way of laser vias, passage openings or the like, but these are not shown in any detail, for simplification of the representation.

Furthermore, through-contacting 5 is indicated in FIG. 1.

A material 6 that prevents adhesion or facilitates subsequent removal is applied to a portion of the core element 1, which material, as becomes evident from the subsequent representations, will prevent direct adherence of at least one further ply or layer when building up the circuit board to be produced, in accordance with a portion to be exposed subsequently.

In the representation according to FIG. 2, it is evident that the core element 1 is covered, on both sides, with a plurality of plies or layers 7, 7', and 7", in each instance, each composed of a non-conductive material, and furthermore covered by conductive plies or layers 8, 8', and 8", indicated here, and connected with these by means of lamination or pressing, for example.

Likewise, further plies or layers composed of a non-conductive material 9, 9', and 9" and a conductive material 10, 10', and 10" are indicated.

A portion of the further plies or layers 7, 7', and 7", disposed above the material 6 that prevents adhesion or facilitates subsequent removal, has a severed region 11 and 12, in each instance, in accordance with the border regions of the material 6, as is explained in detail, particularly using FIGS. 4 to 6. These severed border or edge regions 11, 12 are filled, after severing, with a material that is particularly different from the material of the subsequent regions of the layers 7, 7', and 7" composed of non-conductive material, where these border regions 11 and 12 facilitate subsequent removal of the portion 13 to be removed, or directly ensure removal of the region 13 by means of breaking. If necessary, the same or a similar non-conductive material can also be used.

The situation after removal of this portion 13 is shown in FIG. 3. It is evident that sharp-edged, remaining border or edge regions 14 and 15 are made available by provision of the severed regions 11 and 12, and that these regions can particularly be achieved without complicated additional processing steps, such as etching steps, for example. Furthermore, it is possible to do without the formation of cover layers or stop layers, for example for laser cutting for removal of the portion 13 to be removed, by providing the severed border or edge regions 11 and 12, so that, as is clearly evident from FIG. 3, conductive structures 16 can also be made available, which extend into the exposed portion shown in FIG. 3, proceeding from the portion covered by the layers 7 and 8. In this manner, structuring of conductive elements 16, particularly of the core element 1, can be simplified, because such conductive structures 16 can project directly into regions to be exposed.

In FIG. 4, a detail corresponding to the severed portion 11 of the representation of FIG. 2 is shown in detail, on a larger scale, where conductive structures between the individual layers 7, 7', and 7" are not shown, in order to simplify the representation. Such severing 11 takes place before any connection of the further layers 7, 7', and 7" with the core element 1, according to the embodiment of FIGS. 1 to 3, for example by means of cutting, punching, milling, scoring or the like. The severed portion 11 is subsequently either filled with a material different from the material of the plies or layers 7, 7', and 7", immediately before any connection with the core element 1, or is filled, for example, by means of flowing of resin material or plastic material of the layers 7, 7', and 7" during the connection process with the core element 1, particularly under conditions of elevated temperature and/or elevated pressure. In this connection, the layers 7, 7', and 7" have reinforcements, particularly glass fibers, for example, while only the flowable resin or plastic material penetrates into the severed region, particularly during filling by means of elevated pressure and/or elevated temperature, which material subsequently allows easy removal of the portion 13 to be removed, by means of simple breaking in the region of the severed regions 11, 12, for example.

In FIGS. 5 and 6, further modified embodiments of the production of severed border or edge regions are indicated, which are referred to as 17 and 18.

In agreement with the embodiment shown in FIG. 4, the plies or layers of non-conductive material are once again referred to as 7, 7', and 7", where a core 19 formed by a multilayer circuit board, if applicable, is indicated, on which core a release layer 20 composed of a material that prevents adhesion is indicated. To simplify the representation, the multiple layers of the core element 19 are not shown separately or in detail.

While in the representation according to FIG. 5, a severed region 17 having a very low thickness or width is shown, which region can be produced, for example, by means of cutting with a knife or by punching, in the embodiment according to FIG. 6 it is evident that the severed region 18 has a comparatively great width or thickness, in accordance with a different purpose of use.

In the representation according to FIG. 7, it is indicated that a severed region 21 is severed or cut by means of a laser, for example after a connection with the core element, instead of simple breaking, as is indicated with 22. Particularly due to the fact that the severed region 21, similar to the preceding embodiments, is filled with a material that is particularly free of reinforcements, such a laser cutting process can be carried out at correspondingly greater speed and/or lower power. Alternatively, depth-controlled laser cutting with UV can be provided.

Furthermore, once again precisely defined and sharp-edged border or edge regions can be made available after removal of the portion to be removed, as is clearly shown in FIG. 3, by means of the absence of reinforcements in the previously severed regions 17, 18, and 21.

In FIG. 8, a modified embodiment of a circuit board to be produced is shown, where a core element, once again a multilayer core element referred to as 31, similar to the embodiment according to FIGS. 1 to 3, is provided at least with a non-conductive layer 32, and with conductive and, in particular, structured layers 35 and 36, and is used for the production of a rigid-flexible circuit board. This core element 31 has been covered on both sides by a cover layer 37 and 38, where adhesive layers are indicated with 33 and 34.

Once again, regions composed of a material 39 that prevents adhesion are provided in accordance with a portion of the flexible core element 31 to be exposed, where layers 40 and 41 composed of a non-conductive material are connected with the core element 31 on both sides, respectively. Furthermore, particularly structured conductive layers 42 and 43 are indicated on these layers 40 and 41.

Similar to the preceding embodiment, the portions 44 and 45 that are subsequently to be removed have border or edge regions 46 and 47, which are severed and filled with a material that is different from the subsequent layers 40 and 41.

In similar manner, in FIG. 9 a modified embodiment of a rigid-flexible circuit board to be produced can be seen, where a plurality of layers 40', 40", 41', and 41" has been or is connected with a core element, once again referred to as 31, where layers composed of a conductive material are referred to as 42', 42", 43', and 43".

Similar to the embodiment shown in FIG. 8, regions 39' of the core element 31 are coated with a material that prevents adhesion, where portions 44' and 45' to be removed once again have severed border or edge regions 46' and 47'.

After removal of these portions 44' and 45' to be removed, as shown in FIG. 10, once again precisely defined and sharp-edged border or edge regions 48, 49 occur, similar to an embodiment according to FIGS. 1 to 3, where removal of these portions to be removed can take place by means of simple breaking of the same in the region of the severed parts 46' and 47'. Alternatively, the severed regions, for example, as well as the filled-in material situated in them, are severed using a simple cutting process, for example a laser cutting process, as indicated in FIG. 7.

In all of the above embodiments, precisely defined border or edge regions of portions of a multilayer circuit board to be exposed can thereby be made available in simple and reliable manner, where in particular, is it possible to do without complicated subsequent treatment steps for making such precisely defined edge regions available. This is accomplished by means of forming severed regions of the at least one further layer, which is to be connected with a first element or core element 1, 19, 31 of the circuit board to be produced, and by means of filling with a material different from the material of this further layer, where this essentially makes available a planned breaking point for the subsequent removal of the portion to be removed.

The portion to be removed can thereby be removed in simple manner, also taking into consideration the material 6, 39 that lies underneath and prevents adhesion. Furthermore, because complicated severing of the border or edge regions of the portions to be removed, after connection with the core element 1, 19, 31, is not necessary, in contrast to the state of the art, it is possible to do without the formation of additional conductive layers as stop layers for laser cutting. Likewise, it is possible to do without the use of additional cover layers for protection of components that lie underneath, particularly during the removal process of the portion to be removed. Furthermore, it is possible to achieve or produce a precisely defined border or edge region, in each instance, particularly without the use of materials that demonstrate low flow capacity, even when using cost-advantageous materials provided with reinforcements, for example.

The invention claimed is:

1. Method for producing a circuit board, comprising the following steps:
   providing at least a first element including at least two interconnected layers;
   applying a material to a portion on one of the at least two interconnected layers where the material prevents adhesion to the portion of the first element and defines a region of the first element to be exposed;
   severing a region in at least one further layer that is to cover the region of the first element to be exposed;
   applying the at least one further layer to the first element after the region in the at least one further layer has been severed; wherein the further layer is formed from a material that essentially covers the region to be exposed and is non-conductive;
   connecting the first element and the at least one further layer;
   severing a portion of the at least one further layer along at least one edge of the region of the at least one further layer that has been severed and is over the region of the first element to be exposed; and
   removing the region of the at least one further layer that is over the region of the first element to be exposed of the further layer to expose the region of the first element of the first element to be exposed.

2. Method according to claim 1, where the region of the at least one further layer that is over the region of the first element to be exposed to be removed is essentially rectangular and the sever of the region of the at least one further layer that is over the region of the first element to be exposed includes severing the region of the at least one further layer that is over the region of the first element to be exposed along at least on two edges of the essentially rectangular portion that lie opposite one another.

3. Method according to claim 1, where the material of the at least one further layer is formed by a plastic material configured with a reinforcement and the severed region of the at least one further layer that is over the region of the first element to be exposed is filled by a plastic material without a reinforcement.

4. Method according to claim 3, further comprising filling the removed region of the at least one further layer that is over the region of the first element to be exposed during the connection process with the first element of the circuit board with the plastic material with material from the portion of the at least one further layer from the severed region of the at least one further layer that is over the region of the first element to be exposed by means of one of an elevated temperature and elevated pressure that occurs during the connection process.

5. Method according to claim 1, where the severing of the at least one edge of the region of the at least one further layer that is over the region of the first element to be exposed to be removed is performed in a manner selected from a group consisting of milling, scoring, punching, slitting, and cutting.

6. Method according to claim 1, where the region of the at least one further layer that is over the region of the first element to be exposed is removed by breaking the region of the at least one further layer that is over the region of the first element to be exposed along the severed edge portion after the at least one further layer and the first element have been connected.

7. Method according to claim 1, where the severing after the connection of the first element and the at least one further layer is performed by means of cutting using a $CO_2$ laser.

8. Method according to claim 1, further comprising providing at least one layer composed of a conductive material on the at least one further layer composed of the non-conductive material.

9. Method according to claim 1, where the first element of the circuit board to be produced is formed by a flexible material for the production of a rigid-flexible circuit board.

10. Method according to claim 1, where the first element is connected, on both surfaces, with at least one further layer, wherein subsequently, portions of the at least one further layers that lie opposite one another are removed.

11. The method according to claim 1, wherein the circuit board is a multilayer circuit board.

12. The method according to claim 11, wherein the region of the first element to be exposed is a cavity in a circuit board.

13. The method according to claim 11, wherein the region of the first element to be exposed defines at least one channel in a circuit board.

14. The method according to claim 11, wherein the region of the first element to be exposed exposes at least one element, selected from a group consisting of a register element, and a component in the interior or in inner plies of a multilayer circuit board.

15. The method according to claim 11, wherein the region of the first element to be exposed defines portions of a circuit board configured to be set back.

16. The method according to claim 11, wherein the circuit board is a rigid-flexible circuit board.

* * * * *